United States Patent
De Kok et al.

(10) Patent No.: US 12,349,272 B2
(45) Date of Patent: Jul. 1, 2025

(54) MANUFACTURE OF A CURVED ELECTRONIC DEVICE USING DIFFERENTIAL HEATING AND CURVED ELECTRONIC DEVICE

(71) Applicant: Nederlandse Organisatie voor toegepast-natuurwetenschappelijk onderzoek TNO, 's-Gravenhage (NL)

(72) Inventors: Margaretha Maria De Kok, Eindhoven (NL); Roel Henry Louis Kusters, Sittard (NL); Jan Pieter Hein Van Delft, Westerhoven (NL); Jeroen Franciscus Marinus Schram, Waalre (NL); Adri Van Der Waal, Zaltbommel (NL); Jan-Eric Jack Martijn Rubingh, Geldrop (NL); Jeroen Van Den Brand, Goirle (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 954 days.

(21) Appl. No.: 17/293,348

(22) PCT Filed: Dec. 2, 2019

(86) PCT No.: PCT/NL2019/050796
§ 371 (c)(1),
(2) Date: May 12, 2021

(87) PCT Pub. No.: WO2020/117049
PCT Pub. Date: Jun. 11, 2020

(65) Prior Publication Data
US 2022/0015229 A1    Jan. 13, 2022

(30) Foreign Application Priority Data

Dec. 3, 2018 (EP) ..................... 18209756

(51) Int. Cl.
*B29C 53/84*    (2006.01)
*H05K 1/02*     (2006.01)
(Continued)

(52) U.S. Cl.
CPC ........... *H05K 1/0284* (2013.01); *B29C 53/84* (2013.01); *H05K 1/0274* (2013.01);
(Continued)

(58) Field of Classification Search
CPC .................................................. H05K 3/0014
See application file for complete search history.

(56) References Cited

U.S. PATENT DOCUMENTS 3,244,780 A     4/1966  Levey et al.
4,156,626 A *   5/1979  Souder ................ B29C 65/1425
                                                   392/419

(Continued)

FOREIGN PATENT DOCUMENTS

CN    102804445 A    11/2012
CN    103053044 A    4/2013
(Continued)

OTHER PUBLICATIONS

European Patent Office, International Search Report in corresponding International Application No. PCT/NL2019/050796, dated Mar. 16, 2020 (3 pages).

*Primary Examiner* — William P Watkins, III
(74) *Attorney, Agent, or Firm* — Leydig, Voit & Mayer, Ltd.

(57) ABSTRACT

A curved electronic device (10c) can be formed by a stack with a curved substrate (13) comprising a thermoplastic material (Ms), and at least one electronic component (14) connected to an electronic circuit (15) disposed on the substrate (13). A component area (11) of the substrate surface (11.12) around the electronic component (14) com-
(Continued)

prises a first material (M1) providing relatively low absorption (A1) to light (L) and a surrounding area (12) of the substrate (13) outside the component area (11), comprises a second material (M2) providing relatively high absorption (A2) of the light (L). E.g. as a result of differential heating and thermoforming a first thickness (T1) of the substrate (13) in the component area (11) may be relatively high compared to a second thickness (T2) of the substrate (13) in the surrounding area (12).

18 Claims, 5 Drawing Sheets

(51) Int. Cl.
*H05K 3/00* (2006.01)
*B29B 13/08* (2006.01)
*B29C 53/04* (2006.01)
*B29L 31/34* (2006.01)
*H05K 1/11* (2006.01)

(52) U.S. Cl.
CPC ............ *H05K 3/0014* (2013.01); *B29B 13/08* (2013.01); *B29C 53/04* (2013.01); *B29L 2031/34* (2013.01); *H05K 1/119* (2013.01); *H05K 2201/0112* (2013.01); *H05K 2201/0129* (2013.01); *H05K 2201/0187* (2013.01); *H05K 2201/2054* (2013.01); *H05K 2203/1105* (2013.01)

(56) References Cited

U.S. PATENT DOCUMENTS

| | | | |
|---|---|---|---|
| 11,483,923 B2 * | 10/2022 | Krivec | ................ H05K 3/0014 |
| 2010/0079989 A1 | 4/2010 | Yeh | |
| 2017/0094793 A1 | 3/2017 | Otsubo et al. | |

FOREIGN PATENT DOCUMENTS

| | | |
|---|---|---|
| CN | 108074927 A | 5/2018 |
| JP | 63-104499 | 5/1988 |
| JP | 2008-118773 | 5/2008 |
| JP | 2009252801 A | 10/2009 |
| JP | 2010-272661 A | 12/2010 |
| WO | WO 02/14051 A1 | 2/2002 |
| WO | WO 2017/167875 A1 | 10/2017 |
| WO | WO 2018/077555 A1 | 5/2018 |

* cited by examiner

MANUFACTURE OF A CURVED ELECTRONIC DEVICE USING DIFFERENTIAL HEATING AND CURVED ELECTRONIC DEVICE

CROSS-REFERENCE TO RELATED APPLICATIONS

This patent application is a U.S. National Phase of PCT International Application No. PCT/NL2019/050796, filed Dec. 2, 2019, which claims priority to European Application No. 18209756.8, filed Dec. 3, 2018, which are both expressly incorporated by reference in their entireties, including any references contained therein.

TECHNICAL FIELD AND BACKGROUND

The present disclosure relates to methods of manufacturing curved electronic devices, and resulting products.

Curved substrates can be manufactured e.g. using processes such as thermoforming. Thermoforming typically involves deformation of a material (stack) at elevated temperature. In case (printed) electronics are included in this composition deformation usually requires stretchability of all materials including the electronic. Especially at transitions between more and less thermoplastic materials, the strain can result in failure of electronic paths. Materials used in a stack may include e.g. a carrier (substrate) and electronic materials which are typically dissimilar with regards to their thermal behavior, plastic behavior and stretch behavior. So friction and shear may occur which can result in risks for the integrity of the electronic system.

Various measures can be taken to alleviate the issue. For example, interconnects can be fortified e.g. by additional materials deposited like underfill material underneath the components or globtopping components. For example, materials can be optimized in thermoplastic properties by application of a more flexible glue. Tracks can be fortified by support materials that are less thermoplastic in order to take up strain instead of the most vulnerable materials. By use of meander shapes the required stretchability can be achieved by extrinsic deformation of the meanders combined to intrinsic deformation of the material itself. In this way the stretchability is not only achieved by deformation of the material and thus risks reduced. Design of the electronics can be matched to the design of the 3D shape to locate vulnerable connection in areas that are less deformed. These measures may limit design freedom and are not always applicable.

There remains a need for improved manufacturing of curved electronic devices using thermoforming processes while the electrical components are and remain attached upon thermoforming.

SUMMARY

Aspects of the present disclosure relate to a method of manufacturing a curved electronic device, e.g. user interface. A stack may be provided with substrate comprising a thermoplastic material. One electronic component may be disposed on, or integrated in the substrate. For example, the component may be connected to an electronic circuit arranged on or in the substrate. A surface of the substrate may be illuminated with light (e.g. IR or other wavelengths) to heat at least part of the thermoplastic material above its glass transition temperature. A deformation process can be applied to the (at least partially) heated substrate to deform the stack, e.g. including the electronic circuitry and components, into any desired three-dimensional shape to form the curved electric interface. Preferably, a component area of the substrate surface localized around the electronic component comprises a first material providing relatively low absorption of the light. Preferably, a surrounding area of the substrate, outside the component area, comprises a second material providing relatively high absorption of the light. Accordingly, during a time of the illuminating, the difference in absorption causes buildup of a differential temperature profile in the thermoplastic material along a surface coordinate of the substrate. So the component area around the electronic component can maintain a lower temperature than the surrounding area. At a time of the deformation process, the thermoplastic material at the surrounding area may have a relatively high temperature, e.g. above the glass transition temperature, to provide a relatively low resistance to the deformation process while the thermoplastic material at the component area around the electronic component may have a relatively low temperature, e.g. below the glass transition temperature, to provide a relatively high resistance to deformation process. This higher resistance may prevent excess stress on the electronic component and/or its connection to the electronic circuit.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1:
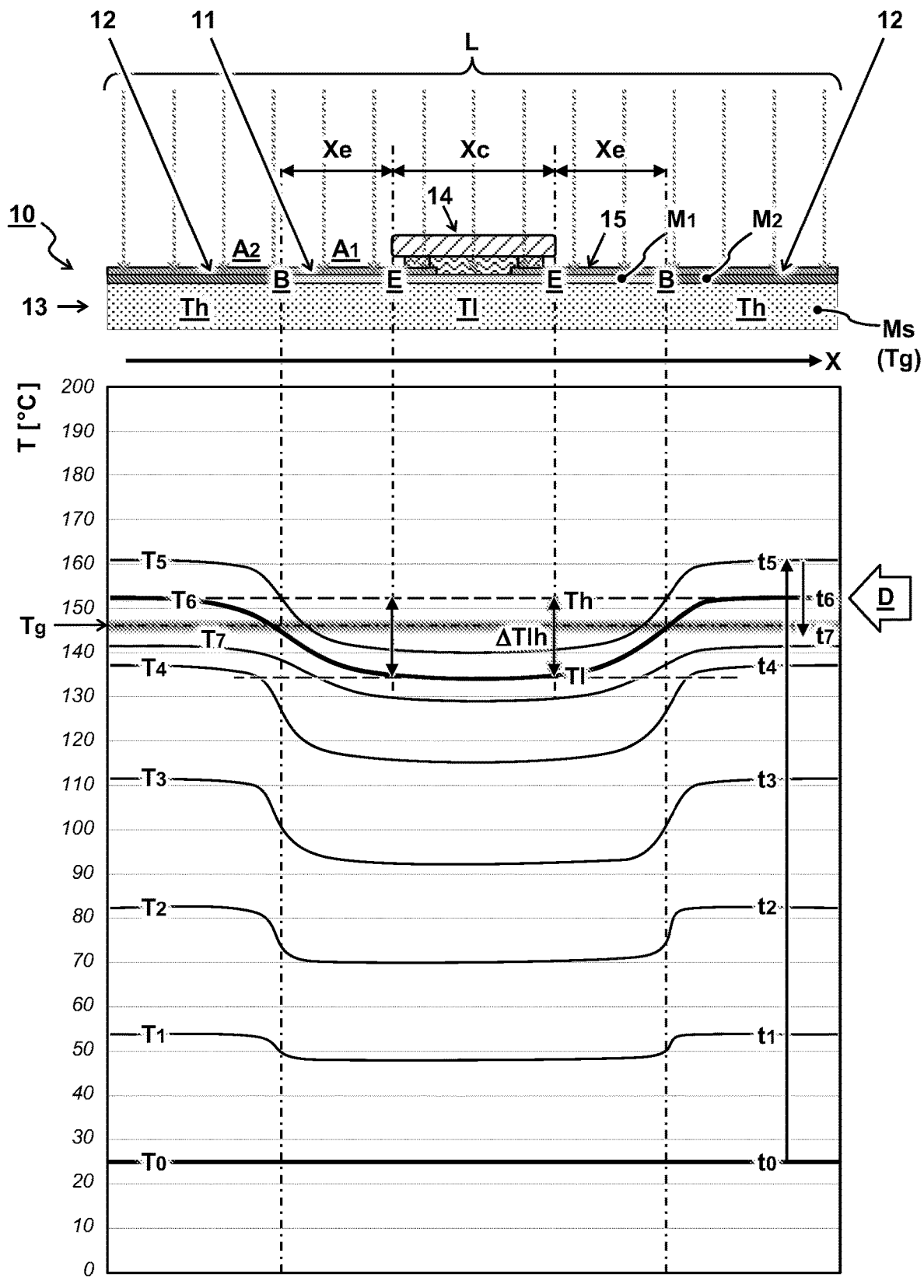
FIG. 1 illustrates a cross-section view of a substrate and schematic graphs of corresponding temperature profiles.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 top illustrates a cross-section view of a substrate 13 with different materials M1,M2 providing different amounts of light absorption A1,A2. The lower part of the figure illustrates a schematic graph of corresponding temperature profiles T1-T7 as a function of substrate position X for a period of illumination (t1-t5) and subsequent cooling (t6,t7).

In one embodiment, a method of manufacturing a curved electronic device 10c comprises providing a stack 10. Preferably, the stack comprises a substrate 13 with a thermoplastic material Ms. Typically the stack may comprise one or more electronic components 14. The components may be connected e.g. to an electronic circuit 15 disposed on the substrate 13. Components can e.g. be silicon based. Additionally, or alternatively, the components may comprise printed structures. The thereto-formability of the components is typically less in comparison to the substrate and additional graphics and conductive pastes for circuitry. In another or further embodiment, a surface 11,12 of the substrate 13 is illuminated with light L to heat at least part of the thermoplastic material M above its glass transition temperature Tg. In another or further embodiment, a deformation process can be is applied to the at least partially heated substrate 13 to deform the stack 10 into the curved electric interface 10c. For example, the curved device may deviate from a flat plate e.g. comprising localized curvatures formed by bumpy features such as buttons, or the whole device may be curved.

In a preferred embodiment, a component area 11 of the substrate surface 11,12 localized around the electronic component 14 comprises a first material M1 providing relatively low absorption A1 of the light L. In another or further preferred embodiment, a surrounding area 12 of the substrate 13, outside the component area 11, comprises a second material M2 providing relatively high absorption A2 of the light L. In some embodiments, during a time t1-t5 of the illuminating, the difference in absorption A2-A1 may cause buildup of a differential temperature profile T1-T5 in the thermoplastic material Ms along a surface coordinate X of the substrate 13.

In a preferred embodiment, the component area 11 around the electronic component 14 maintains a lower temperature than the surrounding area 12. In some embodiments, at a time t6 of the deformation process D, the thermoplastic material Ms at the surrounding area 12 has a relatively high temperature Th above the glass transition temperature Tg to provide a relatively low resistance to the deformation process D. In other or further embodiments, the thermoplastic material Ms at the component area 11 around the electronic component 14 has a relatively low temperature Tl below the glass transition temperature Tg to provide a relatively high resistance to deformation process D. For example, this may contribute to preventing excess stress on the electronic component 14 and/or its connection to the electronic circuit 15.

As described herein the substrate is preferably heated by illumination, e.g. infrared or other radiation. In some embodiments, the substrate is illuminated until the section 12 with the more absorptive material M2 (without component) has reached an optimum (thermo)forming temperature, at least at the time of the deformation process D. For example, the optimum thermoforming temperature may be a temperature above the glass transition temperature Tg of the thermoplastic material Ms, preferably a few degrees (Celsius or Kelvin) above Tg, e.g. in a range between one and thirty degrees above Tg, preferably in a range between five and twenty degrees above Tg, most preferably between five and ten degrees above Tg, e.g. around a temperature where the material becomes soft and pliable.

In some embodiments, a difference in the amount of absorption (A1-A2) between the materials M1,M2 (e.g. absorption rate per unit area of the substrate) is such that the component area 11 localized around the electronic component 14 stays below the glass transition temperature Tg when the surrounding area 12 reaches the optimum thermoforming temperature, e.g. as mentioned above. In some embodiments, the relatively low temperature Tl at the component area 11 is below the glass transition temperature Tg of the thermoplastic material Ms to be thermoformed, preferably at least five degrees, or even more than ten degrees below Tg. The more the temperature is kept below Tg, the better it can be ensured that the substrate at the electronic component 14 sufficiently resists deformation, e.g. also in case there is some temperature variation or equilibration between sections.

In other or further embodiments, the relatively low temperature Tl at the component area 11 around the electronic component 14 can be at least five degrees (Celsius) lower than the relatively high temperature Th at the surrounding area 12, preferably the difference is even higher, e.g. more than ten degrees, more than fifteen degrees, or even more than twenty degrees. The more the difference in temperature, the better it may be ensured that the different section may provide different resistance to the deformation process D.

Various types of thermoplastic material Ms can be used to form the substrate 13. For example, the present figures illustrate polycarbonate (PC) which has a glass transition temperature Tg of about 150° C. (423 K), so it softens gradually around this point and becomes deformable above about 155° C. (428 K). For example, an optimum thermoforming temperature of polycarbonate (at the surrounding area 12) is typically between about 155 and 160° C. For example, the temperature at the component area 11 may be kept below 140° C. Of course these example temperatures may be different for other materials.

As the time t6 of applying the deformation process D may be somewhat later than the end of illumination t5, the temperature in the section M2 at the end of illumination can be somewhat higher than the optimum thermoforming temperature. For example, the substrate may experience some cooling, e.g. by radiative dissipation. In some embodiments, variable radiative dissipation may also be used to tune the temperature. At the same time, there may also be some temperature equilibration, e.g. by conduction, between the differentially heated sections M1,M2 so the temperature differential should be sufficiently high. Preferably, the time (t6-t5) between the end of illumination (t5) and the start of the thermoforming process (t6) is kept as short as possible, e.g. less than ten seconds, preferably less than five seconds, less than two seconds, or even less, e.g. about one-and-half second or less. Alternatively, the thermoforming may immediately follow or even (partially) coincide with the end of the illumination or heating process.

In one embodiment, the heated substrate surface 11 is adapted to provide different absorption by selective application of a coating in the component area 11 and/or surrounding area 12. For example, the coating may be dielectric so it does not interfere with electric functionality. It will be appreciated that the application of a coating can be integrated into a manufacturing process, e.g. before placement of electronic components, wherein the coating is applied at or around their designated locations. By using a dielectric or non-conductive coating, interference with the electrical function of the circuit may be prevented. Alternatively, or in addition the coating may be applied on a bottom side opposite the electronic component so there will be no interference even if the coating is electrically conductive. Alternatively, or in addition, the thermoplastic material. Ms itself may be adapted to provide different absorption and/or reflection at different areas. For example, absorbing and/or reflecting particles or other substances may be mixed in the thermoplastic material Ms, or different thermoplastic materials can be used. For example, metal particles, non-electrical fillers and matrix materials optimized for absorption or reflection can be used as coating or in the substrate material. In one embodiment, areas of the thermoplastic material Ms are selectively irradiated, e.g. using a mask or scanning laser, wherein the patterned irradiation, e.g. by UV or other wavelength, causes a local change of the substrate material or coating making it more or less absorptive to the subsequent illumination by the (homogeneous) light L, as described herein. For example, a UV pattern may cause a localized change in pigmentation for the subsequent IR heating.

In some embodiments, the substrate 13 is uniformly illuminated. For example, light intensity over the illuminated surface of the substrate varies by less than twenty percent, less than ten percent, or less than five percent. By uniformly illuminating the substrate, the heating for different reasons can be more predictable while the differential heating can be accurately controlled using the specifically configured difference in absorption of different substrate regions. Alternatively, the substrate can be selectively illuminated, e.g., using a mask, to preferentially heat the surrounding area 12 and avoid the electronic component 14. This may be combined with the present teachings of different material use.

In some embodiments, the electronic component 14 is disposed on a top side of the substrate 13, wherein the substrate 13 is illuminated from a bottom side opposite the electronic component 14 (not shown). By exclusively illuminating the substrate from the bottom, overheating of the electronic component 14 may be alleviated. In other or further embodiments, the substrate 13 is illuminated from both sides. Preferably, in that case the respective surfaces on both sides of the substrate 13 are adapted to provide the lower absorption at the component area 11 around the electronic component 14 compared to the surrounding area 12. Illumination from both sides may increase heat uptake and provide a more uniform heating along the thickness of the substrate, especially for relatively thick substrates, e.g. more than one millimeter thick. Adapting both sides to selectively absorb the light may improve the division of temperature between the regions with different materials.

In some embodiments, illuminating comprises prolonged application of light, e.g. infrared radiation, during a time period t1-t5, e.g. between one second up to one minute or more depending on the substrate thickness. For example, for a 250 µm thick polycarbonate substrate an illumination period of about five seconds is sufficient, while 2 mm thickness polycarbonate substrate may be illuminated around fifty seconds. In other or further embodiments, the illuminating comprises application of a short light pulse e.g. less than one second. For example, a flash lamp may be used.

In other or further embodiments, the illuminating comprises application of light from at least two different light sources with different wavelength. For example, one wavelength may be absorbed relatively uniformly, while the other wavelength is selectively absorbed leading to the main temperature differential. For example, a light source may be in while a second light source is visible or UV.

In one embodiment, a first wavelength which is absorbed uniformly e.g. infrared, is applied for a prolonged period of time, e.g. more than five seconds, while a second wavelength which is absorbed selectively by the material M1,M2 e.g. UV or visible, is applied for a relatively short period of time, e.g. less than two seconds. For example, a substrate may be uniformly heated by IR light followed by a short flash of UV light to induce the temperature differential.

Figure 2A:
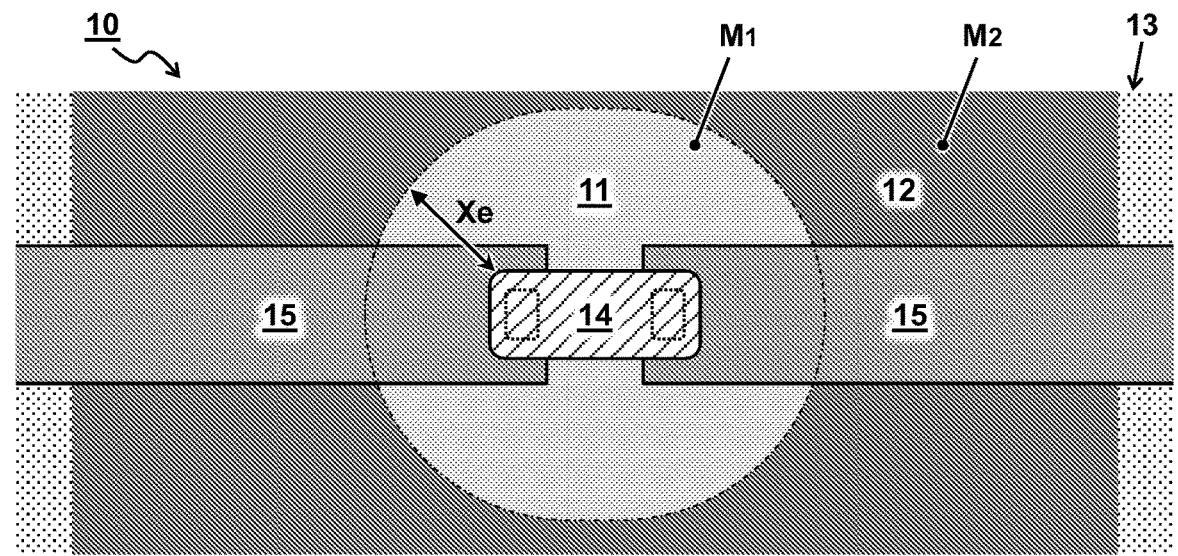
FIG. 2A illustrates a top view of a stack with different materials.
Figure 2B:
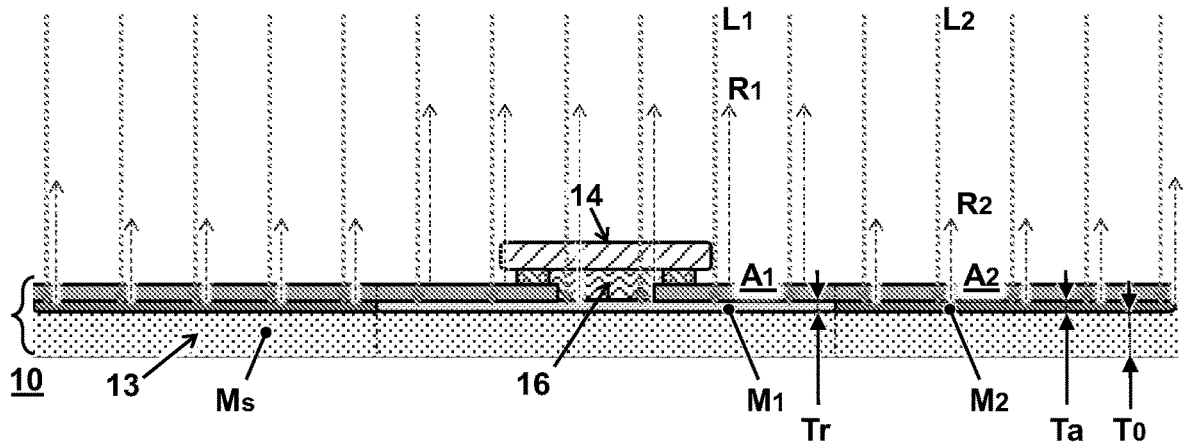
FIG. 2B illustrates a cross-section view of the stack being illuminated.
Figure 2C:
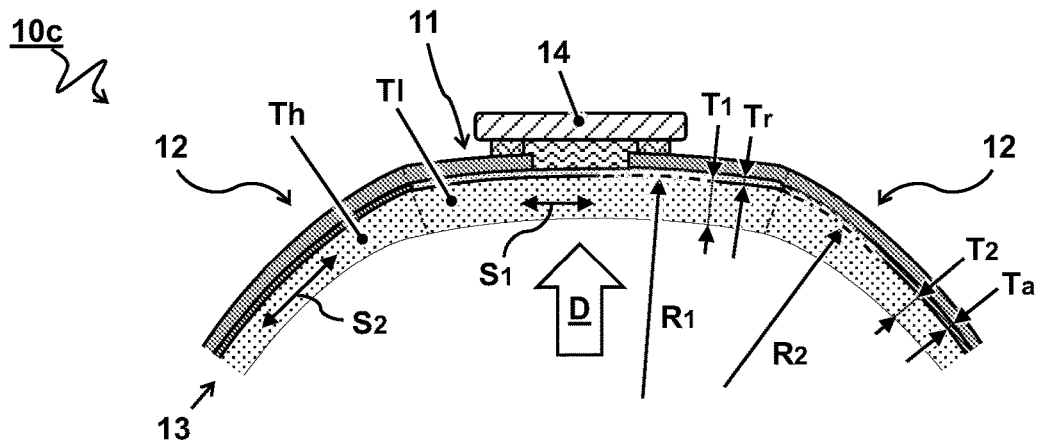
FIG. 2C illustrates a deformation process of the differentially heated stack.

FIG. 2A illustrates a top view of a stack 10 with different materials M1,M2. FIG. 2B illustrates a cross-section view of the stack being illuminated. FIG. 2C illustrates a deformation process D of the differentially heated stack 10 including substrate 13.

In some embodiments, the relatively low temperature Tl of the component area 11 around the electronic component 14 compared to the relatively high temperature Th of the surrounding area 12 causes the component area 11 of the substrate 13 to be more resistant to the deformation process D than the surrounding area 12. For example, the increased resistance to the deformation process D in the component area 11 compared to the surrounding area 12 may cause the component area 11 to deform less than the surrounding area 12 as a result of the deformation process D. For example, the deformation may include bending, stretching, or compressing of substrate sections. Preferably, the decreased bending, stretching anchor compressing in the component area 11 compared to the surrounding area 12 is configured to prevent damage to the electronic component 14 and/or prevent disconnection between the electronic component 14 and the circuit 15 during and after the deformation process D.

In some embodiments, e.g. as a result of differential temperatures during the deformation process D, the (maximum) amount of stretching S1 in the component area 11 around the electronic component 14 is less than the amount of stretching S2 in the surrounding area 12. For example, the surface of the component area 11 (comprising the first material M1) is stretched (compared to the original surface) by a factor less than 1.1 (ten percent), less than 1.05 (five percent), or even less than 1.01 (one percent). The lower the amount of stretching S1 at the electronic component 14, the less stress on the (connections of) the component. On the other hand the relative amount of stretching S2 in the surrounding area 12 (comprising the second material M2, without electronic component 14) can be much higher, e.g. (compared to the original surface) by a factor more than 1.1, more than 1.2, more than 1.5, or even more than a factor two. The higher the amount of stretching S2 in the surrounding area 12, the better the substrate may conform to a desired overall curvature while alleviate stress on the electronic component 14.

In some embodiments, e.g. as a result of differential temperatures during the deformation process D, the substrate 13 preferably undergoes stretching predominantly at regions which are distanced from the electronic components. Typically, the more stretched the substrate 13 experienced locally, the thinner the resulting substrate. Accordingly, the amount of stretching can also be determined afterwards by the relative thickness T1,T2 in the regions 11,12, e.g. compared to each other or compared to the original (uniform) thickness T0.

In some aspects, the present disclosure may relate to a curved electronic device 10c manufactured e.g. according to the methods described herein. In one embodiment, the device comprises or is formed by a stack with a curved substrate 13 comprising a thermoplastic material Ms, and at least one electronic component 14 connected to an electronic circuit 15 disposed on the substrate 13. In another or further embodiment, a component area 11 of the substrate surface 11,12 around the electronic component 14 comprises a first material M1 providing relatively low absorption A1 to (e.g., infrared) light L, and a surrounding area 12 of the substrate 13, outside the component area 11, comprises a second material M2 providing relatively high absorption A2 of said light L.

In some embodiments, a thickness T1 of the substrate 13 in the curved electronic device 10c is relatively high in the component area 11 compared to the thickness T2 of the surrounding area 12. For example, the thickness T1 (e.g. in a section comprising the first material M1) is higher than the thickness T2 (e.g. in a section comprising the second material M2) by more than a factor 1.1 (ten percent), 1.2 (twenty percent), 1.5 (fifty percent), or even more than a factor two (hundred percent more, or twice as thick). Typically, the more the difference in thickness, the less the substrate was stretched during the deformation process D at the component area 11 around the electronic component 14 compared to the surrounding area 12.

In some embodiments, e.g. as a result of differential temperatures during the deformation process D, the (minimum) radius of curvature R1 in the component area 11 around the electronic component 14 is higher than the radius of curvature R2 in the surrounding area 12. For example, the surface of the component area 11 (comprising the first material M1 with the electronic component 14) has a minimum radius of curvature R1 at least twice the (maximum) radius of curvature R2 in the surrounding area 12 (comprising the second material M2, without electronic component 14). For example, the surface of the component area 11 has a minimum radius of curvature more than five centimeters, more than ten centimeters, more than twenty centimeters, more than half a meter, or more than one meter. The higher the local radius of curvature at the electronic component 14, the flatter the surface and the less stress on the component.

As described herein, the stack 10 or substrate 13 preferably comprises one or more electronic components 14 and/or circuits 15 so a curved electronic device 10c can be formed from the stack 10 as a result of the deformation process D. For example, the electronic components may include electrically powered components such integrated circuit (IC) chips, light emitting devices (display or LED), audio components, and/or haptic components. Also interactive electrical components such as touch buttons/regions, et cetera may be arranged in various regions of the substrate. Also other types of electrical transducers can be envisioned. The electronic component 14 and/or circuit can be placed on top of the substrate 13 or integrated in the substrate. Components can also be covered by a second substrate during manufacture or after. Typically, the electronic component 14 stays relatively rigid during the deformation process D compared to the substrate 13. For example, the electronic component 14 does not deform during this process. In one embodiment, the substrate 13 comprises a plurality of electronic component 14 distributed over different locations on the substrate 13. Each one or more electronic components 14 may have its own or shared component area 11 with the first material M1 while the surrounding areas 12 between the electronic components comprise the second material M2. For example, the curved electronic device 10c forms a dashboard, e.g. for use in a vehicle.

As will be appreciated, selective heating can be applied in thermoforming electronic foils, films, or other substrates, in order to avoid large strain on certain locations. For example, on locations where electronic components 14 are adhesively bonded to the surface, strain in the substrate can lead to bond failure, as the rigid component cannot follow this strain. If the strain level on such a location can be limited, this can reduce the risk of failure significantly. This especially holds if the local substrate temperature can be kept below the substrate's glass transition temperature Tg, as the rigidity can be much higher below this point.

Glass transition is generally understood as the gradual and reversible transition in amorphous materials or in amorphous regions within semi-crystalline materials, from a hard and relatively brittle "glassy" state into a viscous or rubbery state as the temperature is increased. Typically, the glass-transition temperature Tg of a material may characterize a small range of temperatures over which this glass transition occurs (e.g. indicated in the graphs as grayscale gradient). Depending on the material, the difference in stiffness below and above Tg can be several orders of magnitude. While different definitions of Tg may vary by a few degrees Celsius (Kelvin) it will be qualitatively clear that the material will be substantially more malleable once a critical threshold in the range over which the glass transition occurs has been crossed. To resolve ambiguity of relative temperatures as used herein the glass transition temperature can be defined with reference to the viscosity, fixing Tg at a value of $10^{13}$ poise or $10^{12}$ Pa·s.

Preferably, the deformation process D comprises thermoforming. For example, the deformation process D comprises applying a predefined macroscopic shape to the stack for thermoforming to the stack. Thermoforming is generally understood as a manufacturing process where a substrate of a thermoplastic thermosoftening plastic material is heated to a pliable forming temperature. Typically, above its glass transition temperature Tg and below its melting point, the physical properties of a thermoplastic change drastically without an associated phase change. The heated substrate can be formed to a specific shape e.g. using a mold, and trimmed to create a usable product. Typically, the substrate, e.g. sheet or film, is heated to a high-enough temperature that permits it to be stretched into or onto a mold and cooled to a finished shape. A particular preferred version of thermoforming is also known as vacuum forming. For example, a machine can be used to heat small cut sections of plastic sheet and stretch it over a mold using vacuum. This method is typically used for sample and prototype parts. In other or further applications, production machines can be utilized to heat and form the substrate and optionally trim the formed parts from the substrate, e.g. sheet, in a continuous high-speed process. Alternatively, or in addition to thermoforming, also other deformation processes can be used for application of the present teachings such as injection molding, blow molding, rotational molding and other forms of processing plastics at elevated temperatures. So where reference herein is made to a thermoforming process or temperature, this may also be applicable to other similar processes.

In some embodiments, the first material M1 comprises a reflective coating with a higher reflection coefficient R1 to the light L than the thermoplastic material Ms of the substrate 13 beneath and/or higher than the second material M2. For example, the reflective coating is configured to reflect more than fifty, seventy, ninety, or even more than ninety-five percent of the light L. The more light is reflected at the component area 11, the less the light will be absorbed there and the lower the temperature of the thermoplastic material Ms around the electronic component 14.

In other or further embodiments, the second material M2 comprises an absorptive coating having a higher absorption coefficient A2 to the light L than the thermoplastic material Ms of the substrate 13 beneath and/or higher than the first material M1. For example, the absorptive coating is configured to absorb more than eighty, ninety, ninety-five, ninety-seven, or even more than ninety-nine percent of the light L. The more of the light L is absorbed at the surrounding area 12, the higher the temperature of the thermoplastic material Ms there. For example, a graphic material can be used wherein a black coating absorbs more and a white coating absorbs less. In some embodiments, the substrate 13 comprises at least three different areas each with different materials having different heat absorption rate. Also a gradual change in absorption can be effected using e.g. a gradient of different materials and/or colors.

Preferably, the reflective and/or absorptive coating is relatively thin. For example, a thickness Tr of the reflective coating and/or a thickness Ta of the absorptive coating is smaller than a thickness of the thermoplastic substrate underneath (e.g. thickness T1 and/or T2 after thermoforming; or the thickness T0 before thermoforming) by at least a factor ten, twenty, thirty, fifty, hundred, or more. The less the thickness of the coating, the more uniform the overall thickness of the combined substrate and/or the less affected the properties, e.g. flexibility, of the substrate by the presence of the coating.

Figure 3A:
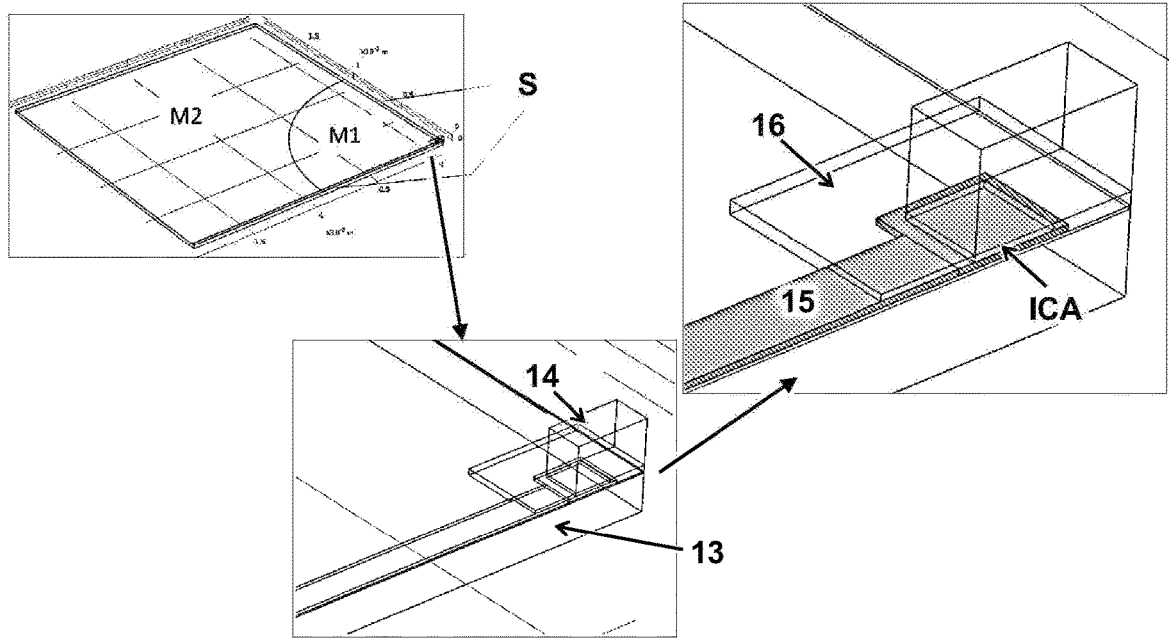
FIG. 3A illustrate perspective images of a simulated geometry.

FIG. 3A illustrate perspective images of simulated geometry (Finite Element Model) to gain further insight into the process.

For reasons of symmetry, it may be sufficient to analyze only a quarter of the structure. In the top left figure the symmetry planes are indicated by "S". The representative simulation describes the heating of a substrate 13, supplied with a (printed) conductive track 15, an adhesively bonded electronic component 14 and two different graphical coating materials M1,M2 on the top surface. In this simulation, energy heat supply occurs on upper and lower surface of the foil. When the surface has reached the desired temperature for thermoforming, heating stops and the foil cools down for 1.5 s, which is approximately the time interval between heating and forming.

The simulated geometry is modeled according to an example structure which has the following characteristics:
- A 40×40 mm² substrate (polycarbonate) has a thickness (T0) of 2 mm (FIG. 3B, 4A, 4B) or 250 µm (FIGS. 5A and 5B);
- A printed silver track (width 400 µm, thickness 20 µm) crosses the substrate;
- In the centre of the substrate, an electronic component (1×0.5×0.3 mm³) is adhesively bonded to the conducting track. The printed bond pad is 0.6×0.35 mm², the isotropic conductive adhesive (ICA) is 0.5×0.25 mm², the ICA thickness is 20 µm;
- The open volume under and around the bonded component is filled with an underfill, with dimensions of 1.6×1.1 mm² and a thickness of 40 µm;
- The region on the substrate around the bonded component is covered by a graphical print (M1) with a radius of 10 mm. The absorption coefficient of the applied material is 0.53;
- The remaining part of the substrate surface is covered by another graphical print (M2). The absorption coefficient of this material is 0.95;
- Both graphical coatings (M1 and M2) have a thickness of 10 µm, and are—in this case—only applied to the upper surface of the substrate.

The following assumptions are made with respect to the model:
- During the heating phase, the upper and lower substrate surface receive the same heating power;
- During and after heating, the substrate surfaces lose (thermal) energy by radiation. The emissivity coefficient is the same as the absorption coefficient.

Figure 3B:
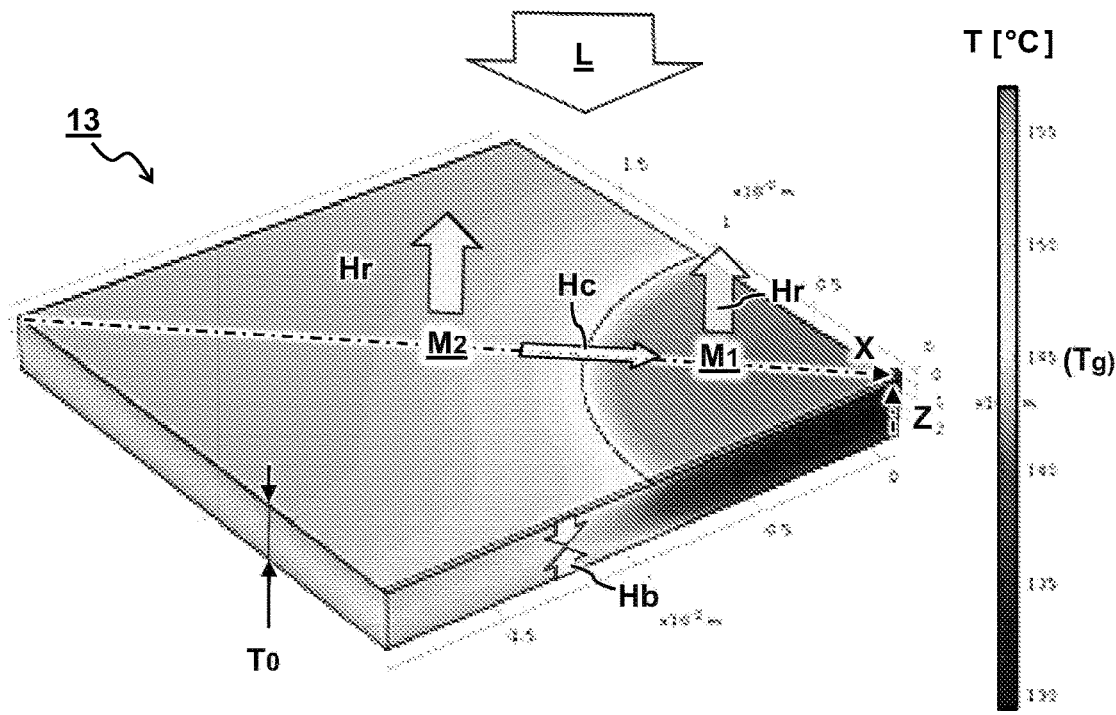
FIG. 3B illustrates a resulting temperature distribution.

FIG. 3B illustrates a resulting temperature distribution according to one of the simulated geometries, here with a substrate thickness of 2 mm. The grayscale indicates the temperatures where the darker colors illustrate the colder region around the electronic component and the lighter colors illustrate the hotter parts of the surrounding area.

During heating, the following thermal processes may be considered:
- temperature increase of the upper and lower surface in the heating phase by illumination (L);
- heat transport (Hb) from the surfaces into the bulk of the material, by conduction;
- heat transport (Hc) from sections with high temperature e.g. the M2 section to sections with lower temperature e.g. the M1 section, by conduction;
- loss of thermal energy (Hr) by radiation to ambient air.

After the heating phase, the temperature differences in the substrate will typically level out in the long run. However, the most relevant situation for the current purposes is the temperature differential shortly after illumination. The present image shows the temperature one and half seconds (1.5 s) after illumination which may be representative of a desired timescale between the end of the heating phase and the forming of the heated substrate.

In order to gain further insight, the temperature profile in the substrate is calculated along various plotlines.

Figure 4A:
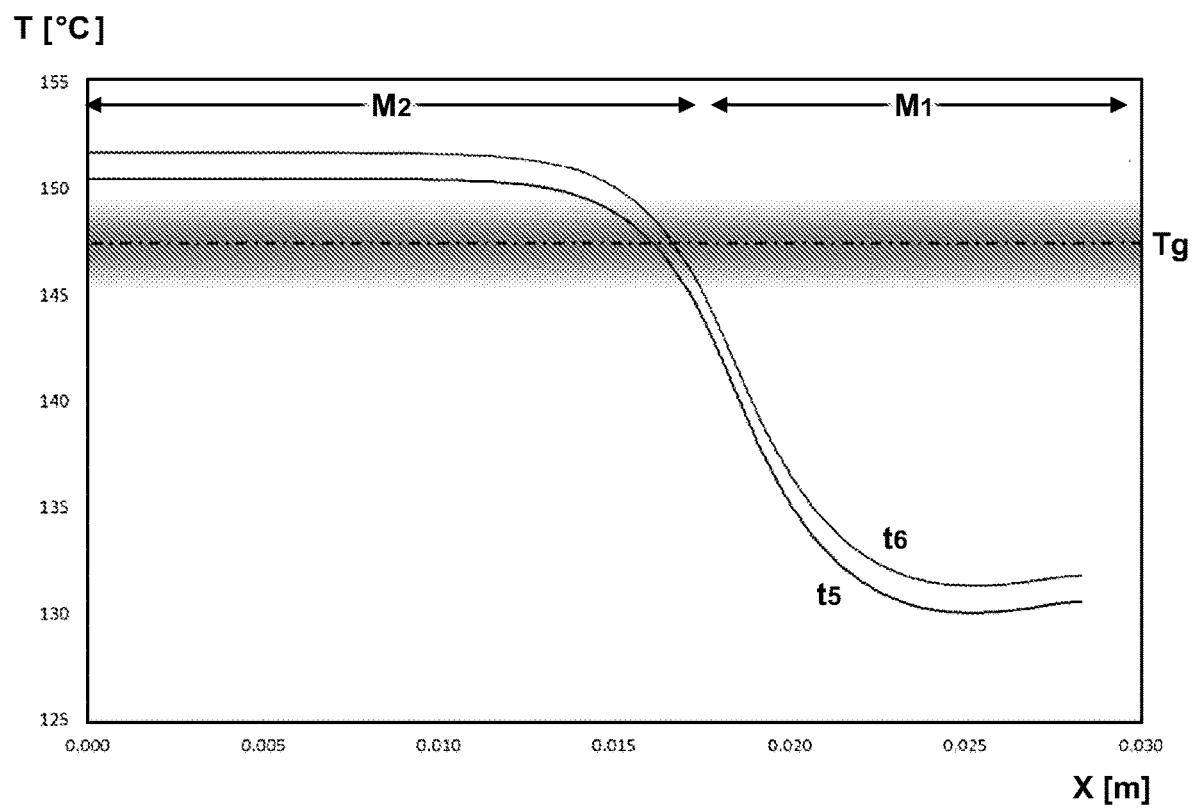
FIG. 4A illustrates horizontal plotlines along the substrate.

FIG. 4A illustrates horizontal plotlines through the centre of the 2 mm substrate at different times t5,t6. The plotline is shown in FIG. 3B as crossing the M2 and M1 section and the sections below the bonded component. The first time t5 corresponds to the end of illumination and the second time t6 corresponds to the thermoforming time, which can be a bit later (here 1.5 seconds). It may be noted that the temperature at the center of the substrate is still increasing after illumination due to (conductive) equilibration with the outer surface regions.

Figure 4B:
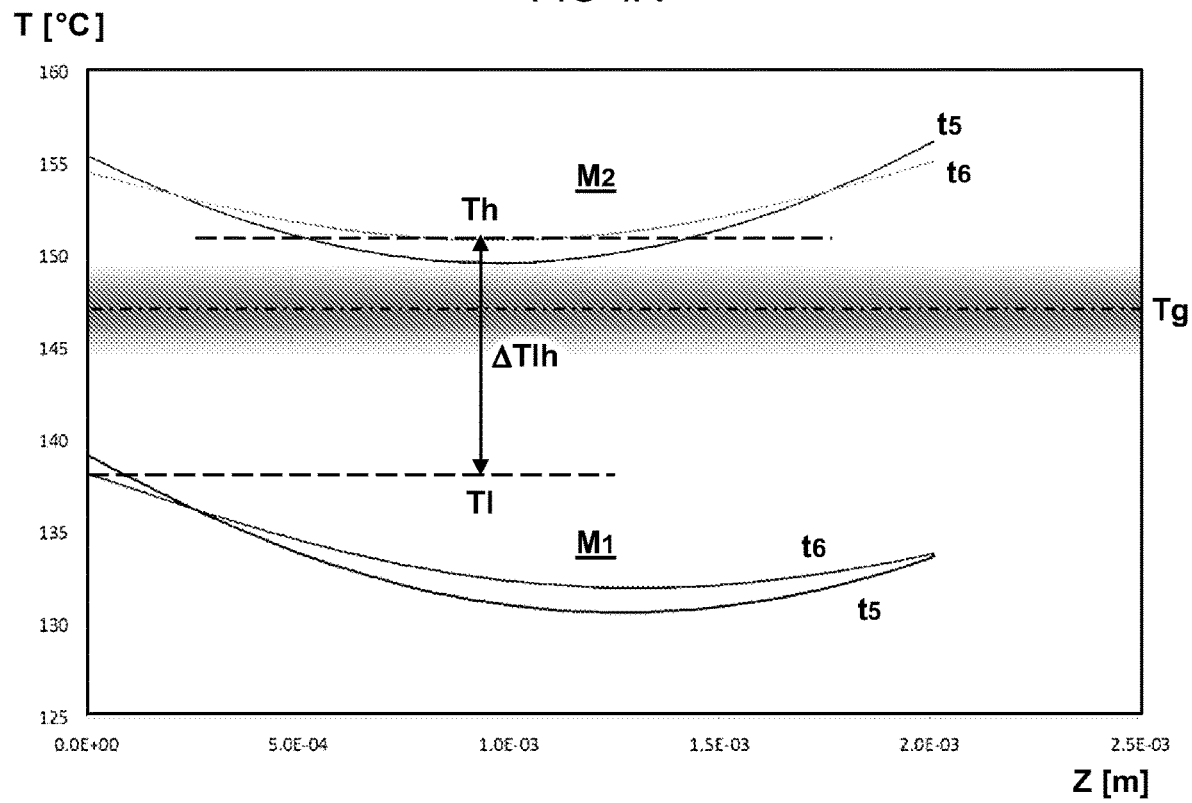
FIG. 4B illustrates vertical plotlines through different sections.

FIG. 4B illustrates vertical plotlines through the M1 section, from lower to upper surface, and vertical plotline through the M2 section, from lower to upper surface. It will be appreciated that the temperature equilibration between the center and outer surface regions of the substrate actually improve the temperature differential $\Delta Tlh$ between the lowest point of the relatively high temperature Th in section M2 and the highest point of the relatively low temperature Tl in section M1. Preferably, this differential $\Delta Tlh$ is larger than the glass transition range, here schematically indicated by the gray gradient so there will be a maximal difference between the malleability of the two regions M1,M2.

Figure 5A:
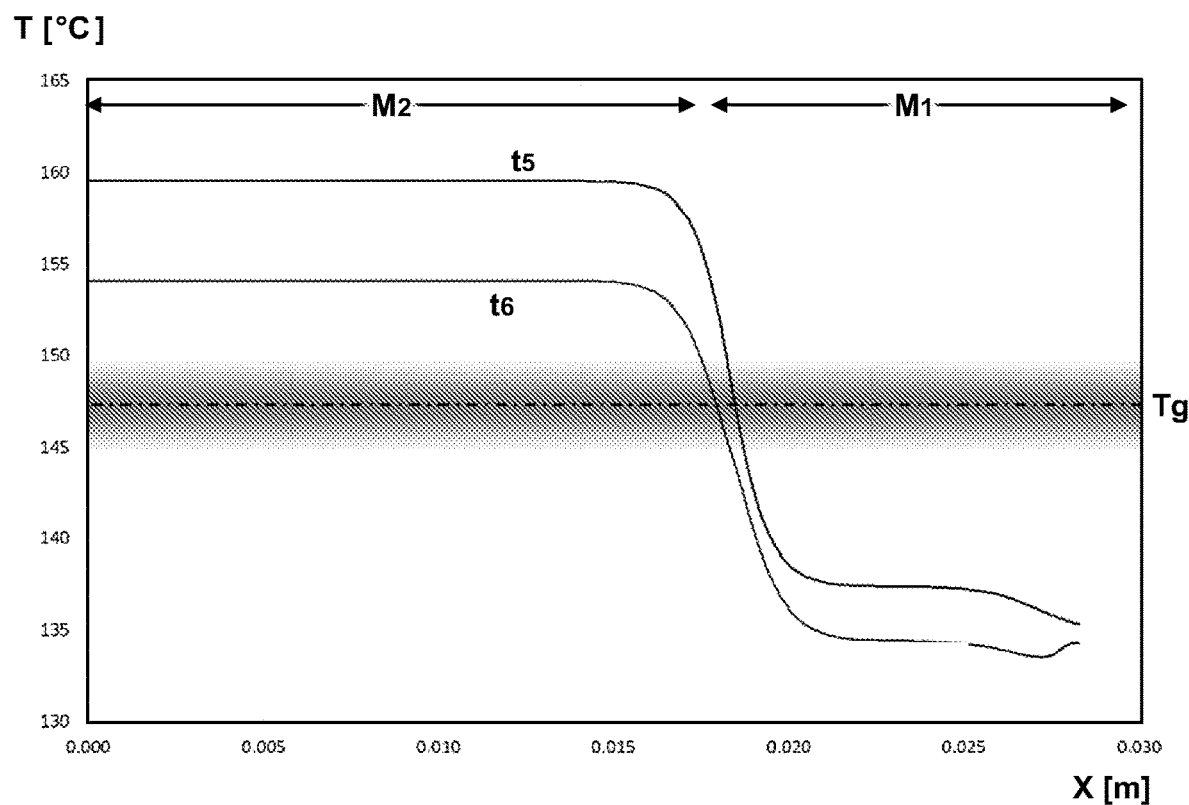
FIGS. 5A and 5B illustrates similar plots for a thinner substrate.
Figure 5B:
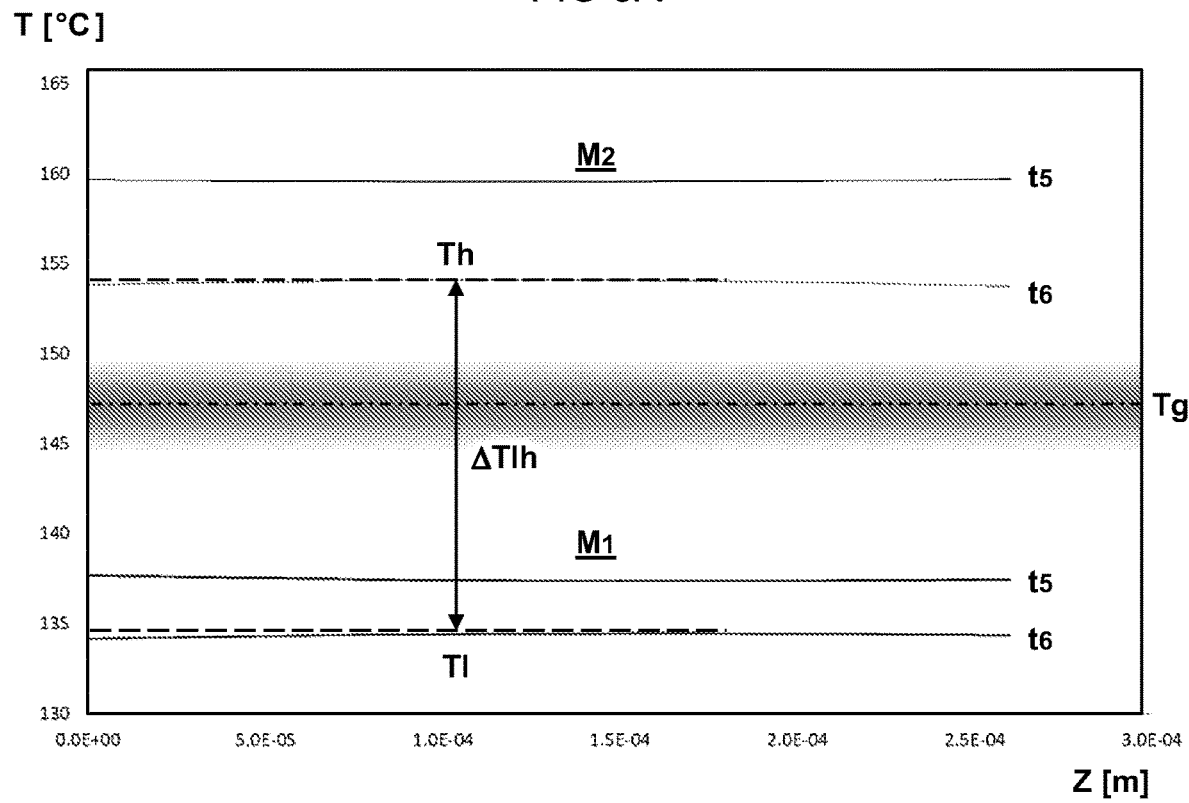

FIGS. 5A and 5B illustrates similar plots as FIGS. 4A and 4B, but now for a relatively thin substrate of 250 μm. As shown in FIG. 5B, the relatively thin substrate has approximately the same temperature on both sides and at the center even though the different material M1,M2 was only coated on one side. Also after illumination there is hardly any temperature equilibration in the direction transverse to the substrate. As shown in FIG. 5A there is some equilibration along the substrate surface between the regions M1 and M2, but within the relatively short time scale (here 1.5 seconds) a sufficient temperature differential $\Delta Tlh$ across the glass transition temperature $Tg$ remains, particularly at the position of the electronic component 14 which is preferably arranged with a certain margin within the border between the sections M1 and M2.

With reference back to FIG. 1, a border B can be defined between the component area 11 of the substrate 13 comprising the first material M1, and the surrounding area 12 comprising the second material M2. For example, the electronic component 14 may be disposed in the component area 11 having a maximum component size Xc (across the substrate 13 surface).

In a one embodiment, the border B is distanced from a closest edge E of the electronic component 14 by an edge margin Xe which is at least twenty or at least fifty percent the maximum component size Xc. Preferably the margin much larger, e.g. Xe is larger than Xc by at least a factor two, three, five, ten, or more. The larger the edge margin Xe compared to the component size Xm, the better the component may be protected from local deformation. On the other hand, if the margin is too large, the substrate may not allow sufficient overall deformation. Accordingly, it may be preferred in some embodiments to keep the factor smaller than hundred, preferably smaller than fifty, more preferably smaller than twenty. For example, Xc<Xe<20*Xe. For example, a component with a footprint of dimensions 2 mm by 1 mm may be surrounded by a section of first material M1 having radius (Xc/2+Xe) of 10 mm. Of course also other sizes and margins can be used depending on various circumstances.

In some embodiments, the substrate 13 comprises thermal isolator material (not shown) arranged e.g. at the border B as a moat around the component area 11, wherein the thermal isolator material has a lower thermal conductivity than the other thermoplastic material Ms of the substrate 13 by at least a factor two, three, four, ten, or more. Using thermally isolating material between the regions 11,12 may improve the temperature differential by preventing conductive equilibration. In some embodiments, the substrate 13 has different thicknesses already before the deformation process D, wherein the different thicknesses contribute to the differential temperature buildup during illumination.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method of manufacturing a curved electronic device, the method comprising:
   providing a stack having:
      a substrate comprising a thermoplastic material, and
      at least one electronic component connected to an electronic circuit disposed on the substrate;
   illuminating a substrate surface of the substrate with light to heat at least part of the thermoplastic material above a glass transition temperature of the thermoplastic material; and
   applying a deformation process to the at least partially heated substrate to deform the stack into the curved electric interface;
   wherein a component area of the substrate surface localized around the electronic component comprises a first material providing relatively low absorption of the light,
   wherein a surrounding area of the substrate surface, outside the component area, comprises a second material providing relatively high absorption of the light,
   wherein the first material comprises a reflective coating with a higher reflection coefficient to the light than the thermoplastic material of the substrate beneath and/or the second material comprises an absorptive coating having a higher absorption coefficient to the light than the thermoplastic material of the substrate beneath,
   wherein, during a time of the illuminating, a difference in absorption causes buildup of a differential temperature profile in the thermoplastic material along a surface coordinate of the substrate such that the component area around the electronic component maintains a lower temperature than the surrounding area,
   wherein at a time of the applying the deformation process:
      the thermoplastic material at the surrounding area has a relatively high temperature above the glass transition temperature to provide a relatively low resistance to the deformation process, and
      the thermoplastic material at the component area around the electronic component has a relatively low temperature below the glass transition temperature to provide a relatively high resistance to deformation process for preventing excess stress on the electronic component and/or a connection of the electronic component to the electronic circuit, and
   wherein the surrounding area fully surrounds the component area.

2. The method according to claim 1, wherein the electronic component comprises an electrically powered or transmitting component that remains relatively rigid during the applying the deformation process compared to the substrate.

3. The method according to claim 1, wherein a border is defined between:
   the component area of the substrate comprising the first material, and
   the surrounding area comprising the second material,
   wherein the electronic component is disposed in the component area having a maximum component size, and wherein the border is distanced from a closest edge of the electronic component by an edge margin which is at least fifty percent the maximum component size.

4. The method according to claim 1, wherein the relatively low temperature at the component area around the electronic component is at least five degrees Celsius below the glass transition temperature of the thermoplastic material, and
wherein the relatively high temperature at the surrounding area distanced from the electronic component is at least five degrees Celsius above the glass transition temperature of the thermoplastic material.

5. The method according to claim 1, wherein a time between an end of an illumination period and a start of the applying the deformation process is less than five seconds.

6. The method according to claim 1, wherein as a result of differential temperatures during the applying the deformation process, an amount of stretching in the component area around the electronic component is less than an amount of stretching in the surrounding area, such that:
a first surface area of the component area at least directly below the electronic component is stretched by a factor less than 1.1 times a first original surface area dimension, and
a second surface area of the surrounding area at least in some of the areas without the electronic component is stretched by a factor more than 1.2 times a second original surface area dimension.

7. The method according to claim 1, wherein, prior to the applying the deformation process, the substrate is flat and uniformly illuminated by the light.

8. The method according to claim 1, wherein the electronic component is disposed on a top side of the substrate, and
wherein the substrate is illuminated from a bottom side opposite the top side of the substrate upon which the electronic component is disposed.

9. The method according to claim 1, wherein the substrate is illuminated from both sides,
wherein respective surfaces on both sides of the substrate are adapted to provide a lower absorption of the light at the component area around the electronic component relative to the surrounding area.

10. The method according to claim 1, wherein the illuminating the substrate surface comprises applying light from at least two different light sources producing light of different wavelengths,
wherein during the applying:
a first wavelength that is absorbed relatively uniformly by the substrate is applied for a prolonged period of time, and
a second wavelength that is absorbed selectively by the material is applied for a relatively short period of time using a light pulse from a flash lamp.

11. The method according to claim 1, wherein the substrate comprises thermal isolator material arranged as a moat around the component area, wherein the thermal isolator material has a lower thermal conductivity than the other thermoplastic material of the substrate by at least a factor two.

12. The method according to claim 1, wherein the illuminated substrate surface is adapted to provide different absorption by a selectively applying a dielectric coating in the component area and/or the surrounding area.

13. The method according to claim 1, wherein a thickness of the reflective and/or absorptive coating is smaller than a thickness of the thermoplastic material of the substrate beneath by at least a factor of ten.

14. A curved electronic device formed by deforming a stack to render a deformed stack having:
a curved substrate comprising a thermoplastic material, and
at least one electronic component connected to an electronic circuit disposed on the substrate,
wherein a component area of the substrate surface around the electronic component comprises a first material providing relatively low absorption to light,
wherein a surrounding area of the substrate, outside the component area, comprises a second material providing relatively high absorption of the light, wherein the first material comprises a reflective coating with a higher reflection coefficient to the light than the thermoplastic material of the substrate beneath and/or the second material comprises an absorptive coating having a higher absorption coefficient to the light than the thermoplastic material of the substrate beneath, and
wherein the surrounding area fully surrounds the component area.

15. The curved electronic device according to claim 14, wherein a first thickness of the thermoplastic material of the substrate in the component area is relatively high compared to a second thickness of the thermoplastic material of the substrate in the surrounding area,
wherein the first thickness (T1) is higher than the second thickness by more than a factor 1.1, and
wherein a thickness of the reflective and/or absorptive coating is smaller than a thickness of the thermoplastic material of the substrate beneath by at least a factor ten.

16. The method of claim 1, wherein the surrounding area is entirely illuminated during the illuminating.

17. A method of manufacturing a curved electronic device, the method comprising:
providing a stack having:
a substrate comprising a thermoplastic material, and
at least one electronic component connected to an electronic circuit disposed on the substrate;
illuminating a substrate surface of the substrate with light to heat at least part of the thermoplastic material above a glass transition temperature of the thermoplastic material; and
applying a deformation process to the at least partially heated substrate to deform the stack into the curved electric interface;
wherein a component area of the substrate surface localized around the electronic component comprises a first material providing relatively low absorption of the light,
wherein a surrounding area of the substrate surface, outside the component area, comprises a second material providing relatively high absorption of the light,
wherein the first material comprises a reflective coating with a higher reflection coefficient to the light than the thermoplastic material of the substrate beneath and/or the second material comprises an absorptive coating having a higher absorption coefficient to the light than the thermoplastic material of the substrate beneath,
wherein, during a time of the illuminating, a difference in absorption causes buildup of a differential temperature profile in the thermoplastic material along a surface coordinate of the substrate such that the component area around the electronic component maintains a lower temperature than the surrounding area,
wherein at a time of the applying the deformation process:
the thermoplastic material at the surrounding area has a relatively high temperature above the glass transition temperature to provide a relatively low resistance to the deformation process, and the thermoplastic material at the component area around the electronic component has a relatively low temperature below the glass transition temperature to provide a relatively high resistance to deformation process for preventing excess stress on the electronic component and/or a connection of the electronic component to the electronic circuit, and wherein the illuminating the substrate surface comprises uniformly illuminating both the component area of the substrate surface localized around the electronic component and the surrounding area.

18. The method of claim 1, wherein the reflective coating and/or the absorptive coating is interposed between the thermoplastic material and the light source.

* * * * *